(12) United States Patent
Timopheev

(10) Patent No.: US 11,860,250 B2
(45) Date of Patent: Jan. 2, 2024

(54) MAGNETIC ANGULAR SENSOR DEVICE FOR SENSING HIGH MAGNETIC FIELDS WITH LOW ANGULAR ERROR

(71) Applicant: Crocus Technology SA, Grenoble (FR)

(72) Inventor: Andrey Timopheev, Vif (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 201 days.

(21) Appl. No.: 17/312,531

(22) PCT Filed: Nov. 26, 2019

(86) PCT No.: PCT/IB2019/060175
§ 371 (c)(1),
(2) Date: Jun. 10, 2021

(87) PCT Pub. No.: WO2020/121095
PCT Pub. Date: Jun. 18, 2020

(65) Prior Publication Data
US 2022/0050151 A1    Feb. 17, 2022

(30) Foreign Application Priority Data

Dec. 11, 2018 (EP) .................... 18315049

(51) Int. Cl.
*G01R 33/09* (2006.01)
*G01B 7/30* (2006.01)

(52) U.S. Cl.
CPC ............. *G01R 33/098* (2013.01); *G01B 7/30* (2013.01)

(58) Field of Classification Search
CPC .............................. G01R 33/098; G01B 7/30
See application file for complete search history.

(56) References Cited

U.S. PATENT DOCUMENTS

| 11,428,758 B2 * | 8/2022 | Hu .......................... H10N 50/01 |
| 2016/0056371 A1 | 2/2016 | Lei et al. |
| 2020/0326391 A1 * | 10/2020 | Braganca ........... G01R 33/0094 |

FOREIGN PATENT DOCUMENTS

| JP | 2011027633 A | 2/2011 |
| JP | 2014157985 A | 8/2014 |

OTHER PUBLICATIONS

International Search Report for PCT/IB2019/060175 dated Mar. 11, 2020.
Written Opinion for PCT/IB2019/060175 dated Mar. 11, 2020.

* cited by examiner

*Primary Examiner* — Reena Aurora
(74) *Attorney, Agent, or Firm* — Pearne & Gordon LLP

(57) ABSTRACT

Magnetic angular sensor device destined to sense an external magnetic field, the sensor device including a plurality of magnetic sensor elements, each sensor element including a magnetic tunnel junction containing a ferromagnetic reference layer having a reference magnetization that is pinned in a pinning direction, a ferromagnetic sense layer having a sense magnetization that can be oriented in an external magnetic field, and a tunnel barrier spacer layer, between the reference layer and the sense layer; wherein the sense layer of at least a portion of said plurality of sensor elements comprises an in-plane uniaxial sense magnetic anisotropy having an easy axis that is aligned substantially parallel to the pinning direction, such that an angular deviation in the alignment of the direction of the sense magnetization in the external magnetic field is minimized for a range of external magnetic field.

12 Claims, 8 Drawing Sheets

MAGNETIC ANGULAR SENSOR DEVICE FOR SENSING HIGH MAGNETIC FIELDS WITH LOW ANGULAR ERROR

FIELD

The present invention concerns a magnetic angular sensor device comprising a plurality of the magnetic angular sensor element for detecting a magnetic field angle over a 360° range of measurement in a plane.

DESCRIPTION OF RELATED ART

Magnetic tunnel junction (MTJ) based magnetic angular sensors provide a high sensitivity, wide-range of their output resistance, better integration into CMOS process and many other attractable features compared to the competing technologies existing on the market.

Such magnetic angular sensors require a specific MTJ typically comprising two magnetically different ferromagnetic layers separated by a dielectric tunnelling barrier. One of the ferromagnetic layers (sensing layer) is magnetically soft and is easily aligned by an external magnetic field, the other one is magnetically rigid (reference layer) with a pinned direction of its magnetization.

Tunnel magnetoresistance (TMR) effect is employed to sense the relative angle between the magnetization of the sensing layer and the magnetization of the reference layer, and thus to measure a direction of an external magnetic field. Change of the relative angle between the sensing layer and the reference layer magnetization can be determined by measuring a change of the electrical conductivity through the MTJ stack. The conductivity of a MTJ stack follows a cosine function of the relative angle between net magnetization direction in the sensing and reference layers.

FIG. 1 shows a single-branch sensing circuit 10 comprising a magnetic sensor element 20. FIG. 2 shows a cross section view of a magnetic sensor element 20 comprising a magnetic tunnel junction 2 containing a tunnel barrier spacer layer 22 sandwiched between a ferromagnetic reference layer 23 and a ferromagnetic sense layer 21.

The ferromagnetic reference layer 23 has a reference magnetization 230 that is pinned in a pinning direction 231. The ferromagnetic sense layer 21 has a sense magnetization 210 that can be freely oriented relative to the reference magnetization 230. When the sensor element 20 is in the presence of an external magnetic field 60, the reference magnetization 230 remains substantially fixed in its pinned direction 231 while the sense magnetization 210 is deflected in the direction of the external magnetic field 60. Pinning the reference magnetization 230 can be achieved by a pinning layer 24 (such as an antiferromagnetic layer) exchange coupled to the reference magnetization 230.

The direction of the external magnetic field 60 can thus be measured by passing a sensing current 31 (see FIG. 1) in the magnetic sensor element 20 and measuring voltage difference ($V_{out}-V_{in}$). The voltage difference is proportional to the resistance R of the magnetic sensor element 20. The electrical conductance (1/R) follows a cosine of the angle between direction of magnetic field 60 and pinned direction 231.

For two-dimensional (2D) magnetic field sensing applications, the reference magnetization 230 usually lies in-plane (in the plane of the reference layer 23). The magnetic state of the sensing layer can be different: it can be magnetized 1) in-plane, 2) out-of-plane, 3) being in a vortex micromagnetic state etc. The first magnetic state provides magnetic field angle sensing only (i.e. without magnetic field amplitude) since magnetization of sensing layer is always magnetically saturated by the external magnetic field. The two others magnetic states are quasi-linear and therefore magnetic field amplitude can also be extracted. A 2D magnetic field sensor can be obtained by measuring electrical signal from two sensor elements 20 where the reference magnetization 230 in one sensor element 20 is pinned in a direction that is substantially orthogonal to the direction of the pinned reference magnetization 230 of the other sensor element 20. Arctangent of the instantaneous ratio of their conductances will give the magnetic field angle. Similarly, each of these two sensing branches, i.e. each of the sensor elements 20, can be replaced by a half bridge (comprising two sensor elements 20) or a full bridge (comprising four sensor elements 20), so that a sensing axis (corresponding to a direction of the reference magnetization 230 of one of the sensors elements 20) of a half bridge or a full bridge would be parallel to the direction of the pinned direction 231 for the corresponding sensor element 20.

Ideally, the reference magnetization 230 should have an infinite stiffness such that its direction is not affected by the external magnetic field 60, at least within a useful range of the external magnetic field 60. In contrast, the sense magnetization 210 should be perfectly soft such that its direction is magnetized perfectly in the direction of the external magnetic field 60.

Practically however, the sense layer 21 has a finite magnetic anisotropy. The sense magnetization 210 can be subjected to finite stray field from the reference layer 23. This causes angular errors in the alignment of the sense magnetization 210 in the external magnetic field 60 and thus, in the expected resistance R of the magnetic sensor element 20 for a given orientation of external magnetic field 60. These angular errors limit operational margin of the sensor at low magnitudes of the external magnetic field, since the angular error increases when lowering the magnitude of the external magnetic field 60.

Moreover, the reference magnetization 230 has finite magnetic stiffness and therefore can be deflected (even only slightly) by the external magnetic field 60. This also produces angular errors in the alignment of the sense magnetization 210. These angular errors increase with the magnitude of the external magnetic field 60 and therefore limit the high-field operation margin of the magnetic sensor element 20.

FIG. 3 reports the variation of the total angular error as a function of the magnitude of an external magnetic field $H_{ext}$. The total angular error corresponds to a difference between the measured relative angle θ between the direction of the sense magnetization 210 and reference magnetization 230 (see FIG. 5) when an external magnetic field ($H_{ext}$) is applied and an "ideal" relative angle, i.e., when the sense magnetization 210 is completely aligned in the direction of the external magnetic field $H_{ext}$ and when the reference magnetization 230 is not deflected by the external magnetic field $H_{ext}$. The variation of the total angular error AET corresponds to the sum of the angular error AES in the orientation of the sense magnetization 210 due to anisotropy in sense layer 21, bias field etc., and angular error AER in reference magnetization 230 orientation due to finite reference layer 23 pinning strength.

FIG. 5 shows a sensing circuit comprising two magnetic sensor elements 20 arranged in a half-bridge sensing circuit configuration 100. The half-bridge sensing circuit 100 produces an output voltage $V_{out}$ between the two sensor elements 20 that is a fraction of its input voltage $V_{in}$. One of the two magnetic sensor elements 20 has a reference magnetization 230 that is pinned in a direction opposed the sense magnetization 210 of the other magnetic sensor element 20.

A sensing axis 250 of the half-bridge circuit 100 can coincide with the pinning direction of one of the magnetic sensors 20, i.e. the direction of the reference magnetization 230 of this magnetic sensor 20. In the example of FIG. 5, the sensing axis 250 of the half-bridge circuit 100 coincides with the pinning direction of the top magnetic sensors 20.

As discussed above, the reference magnetization 230 in the two magnetic sensor elements 20 can be deflected towards the direction of an applied external magnetic field 60 (shown by the curved arrow in FIG. 5). The deflection causes the reference magnetization 230 to be more parallel to the sense magnetization 210 and tends to decrease the resistance in each of the two magnetic sensor elements 20. However, the half-bridge sensing circuit 100 configuration results in a lower relative change in the voltage divider ratio $V_{out}/V_{in}$ than the relative change of resistance in each magnetic sensor elements 20 measured separately. This is achieved due to the opposed direction of the pinned reference magnetization 230 in the two magnetic sensor elements 20. Thus, the half-bridge sensing circuit 100 allows for partial compensation of the angular error AER (thus of the total angular error AET) due to the deflection of the reference magnetization 230.

FIG. 4, compares the variation of the total angular error AET as a function of the magnitude $H_{ext}$ of an external magnetic field, calculated for the single-branch sensing circuit 10 of FIG. 1 (line with triangles) and for the half-bridge sensing circuit 100 of FIG. 5 (single line). The calculations were made for different magnitude of anisotropy in the sensing layer 21 (Hua), and different magnitudes for pinning strength of the reference layer 23 (Hud). The half-bridge sensing circuit 100 shows lower total angular error AET compared to the single-branch sensing circuit 10 of FIG. 1 (see FIG. 3). Compensation of finite reference layer pinning strength is not fully achieved by using a half bridge circuit configuration. Therefore, angular error keeps increasing at high fields.

A 2D angular sensor working in a wide range of magnetic fields (100-1000 Oe) would thus require a magnetic sensor element 20 having a ultra-rigid reference layer (effective pinning field Hud>10 kOe) and ultra-soft sensing layer (Hk<3 Oe). However, it is technologically difficult to obtain such a magnetic sensor element on full-sheet level and almost impossible in case of real patterned magnetic sensor elements experiencing a variety of different mechanical stresses introduced by the sensor layout.

SUMMARY

The present disclosure describes a 2D magnetic angular sensor device comprising a plurality of magnetic sensor elements, each sensor element comprising a magnetic tunnel junction containing a ferromagnetic reference layer having a reference magnetization that is pinned in a pinning direction, a ferromagnetic sense layer having a sense magnetization that can be oriented in an external magnetic field, and a tunnel barrier spacer layer, between the reference layer and the sense layer; wherein the sense layer of said plurality of sensor elements comprises an in-plane uniaxial sense magnetic anisotropy having an easy axis that is aligned substantially parallel to the pinning direction, such that an angular deviation in the alignment of the direction of the sense magnetization in the external magnetic field is minimized for a range of external magnetic field.

The magnetic anisotropy in each sensing layer is substantially equal in magnitude for all sensor elements and the easy axis is always directed along the pinned direction of the reference layer.

The magnetic angular sensor device described herein can use usual MTJ stack with usual reference layer pinning strength and finite anisotropy in sensing layer, yet allowing for measuring an external magnetic field angle in a plane, wherein the external magnetic field has high magnitudes and wherein the measurement is performed with low angular error.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
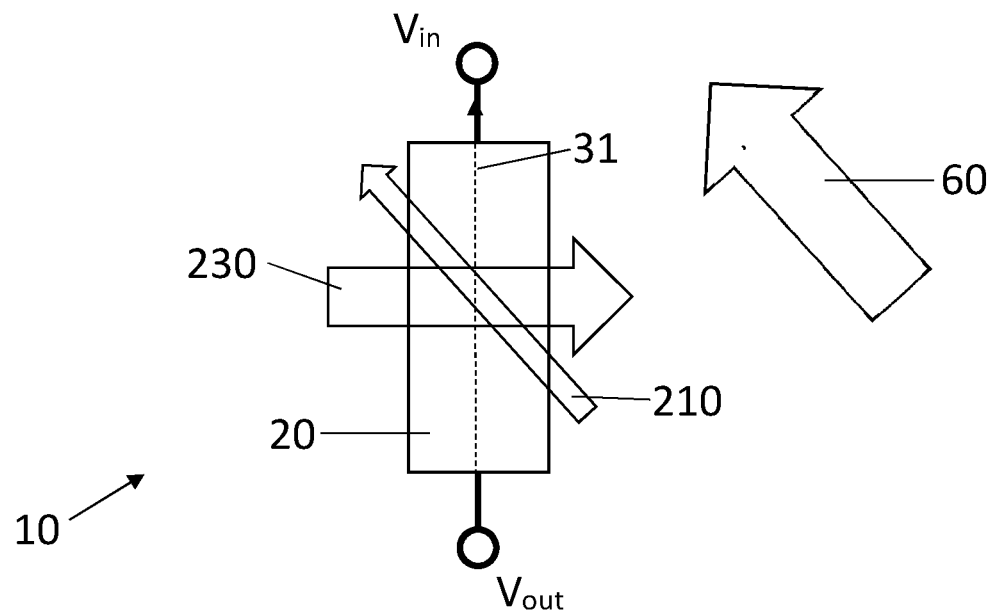
FIG. 1 shows a magnetic angular sensor device comprising a plurality of magnetic sensor elements.
Figure 2:
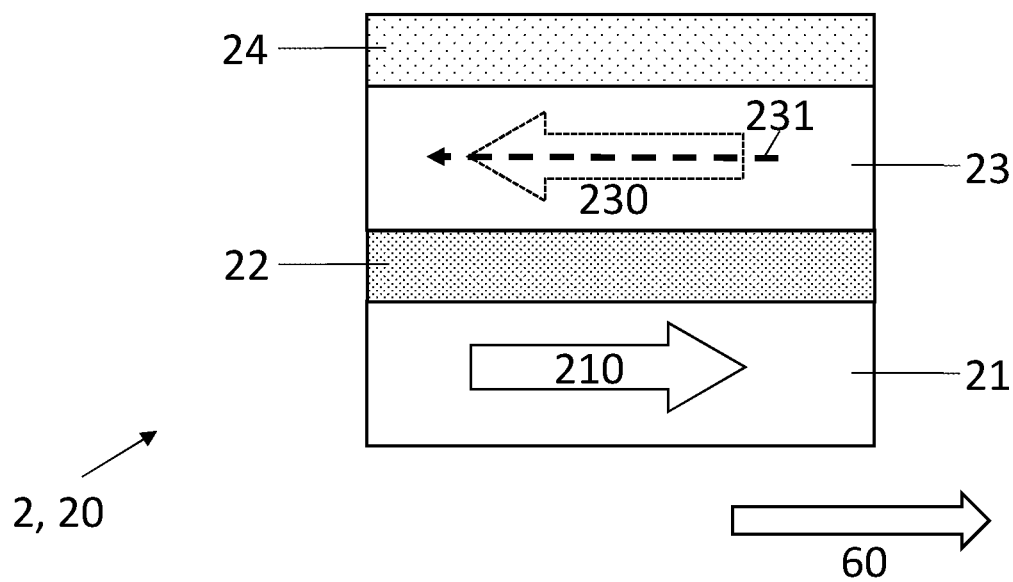
FIG. 2 shows a side view of a magnetic sensor element made form an MTJ multilayered stack.
Figure 3:
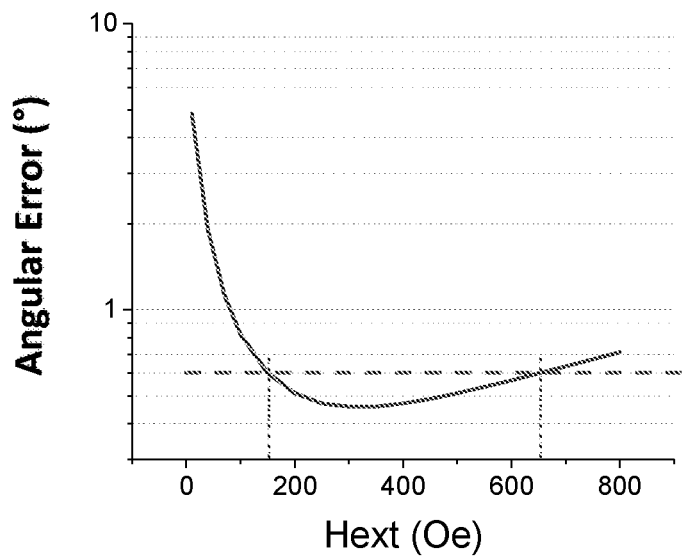
FIG. 3 shows usual dependence of angular error of a 2D sensor which is growing at low fields due to finite anisotropy in sensing layer and at the same time growing at high fields due to finite pinning strength of the reference layer.
Figure 4:
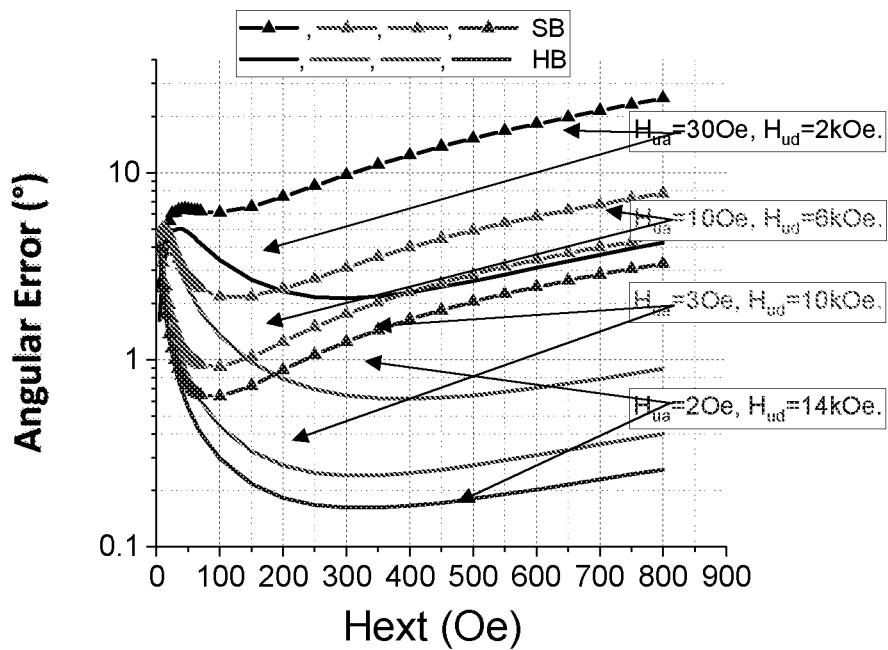
FIG. 4 compares the variation of total angular error as a function of the magnitude of an external magnetic field, for a single-branch sensing circuit and for a half-bridge sensing circuit.
Figure 5:
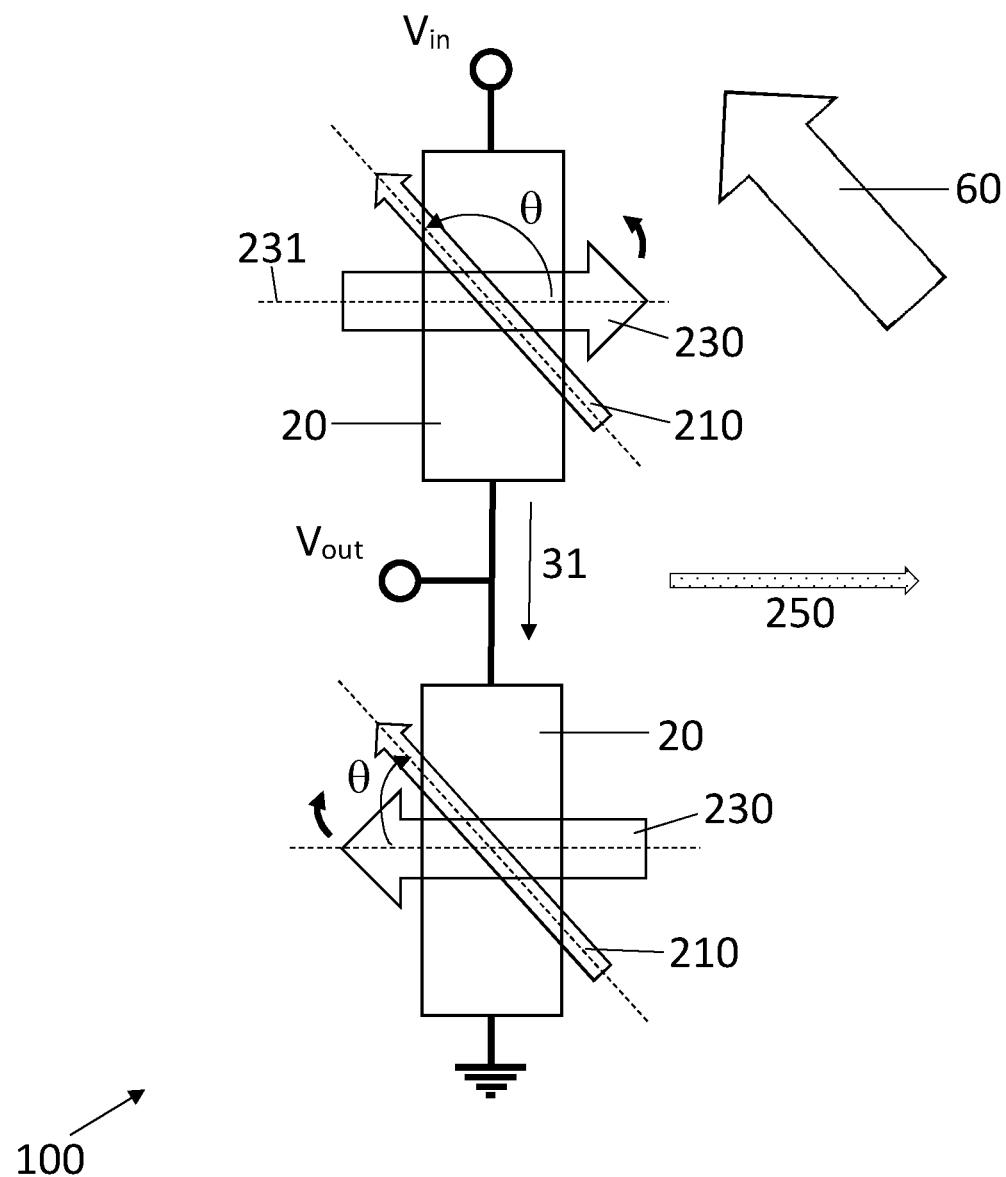
FIG. 5 shows a sensing circuit comprising two magnetic sensor elements arranged in a half-bridge circuit configuration, wherein the sensing axis of the half bridge coincides with the pinning direction of the top sensing element.
Figure 6:
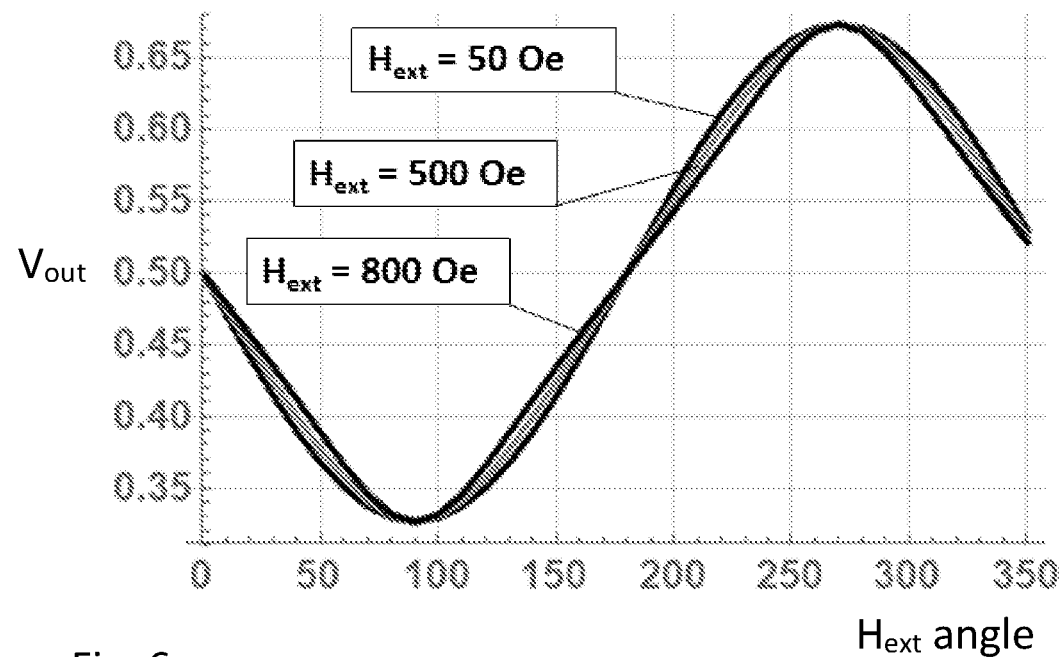
FIG. 6 shows distortion of the output voltage of the half-bridge sensing circuit of FIG. 5; according to a variant.

FIG. 6 shows distortion of the output voltage $V_{out}$ of the half-bridge sensing circuit 100 of FIG. 5 as a function of the orientation of the external magnetic field 60, for a magnitude of the external magnetic field 60 of 50 Oe, 500 Oe and 800 Oe.

For high magnitudes of the external magnetic field 60 (at least greater than 50 Oe), finite magnetic stiffness of reference magnetization 230 causes a characteristic "triangular" distortion of the output signal $V_{out}$. The distortion results in an angular error in the orientation of the sense magnetization 210 relative to the orientation of the external magnetic field

60. For an external magnetic field 60 of 50 Oe, the simulated curve corresponding to the output signal $V_{out}$ has a substantially sinusoidal shape and the angular error is minimal. For an external magnetic field 60 of 500 Oe and 600 Oe, the distortion becomes more pronounced resulting in a more "triangular" shape of the simulated curve of the output signal $V_{out}$. The angular error is also increased.

Figure 7:
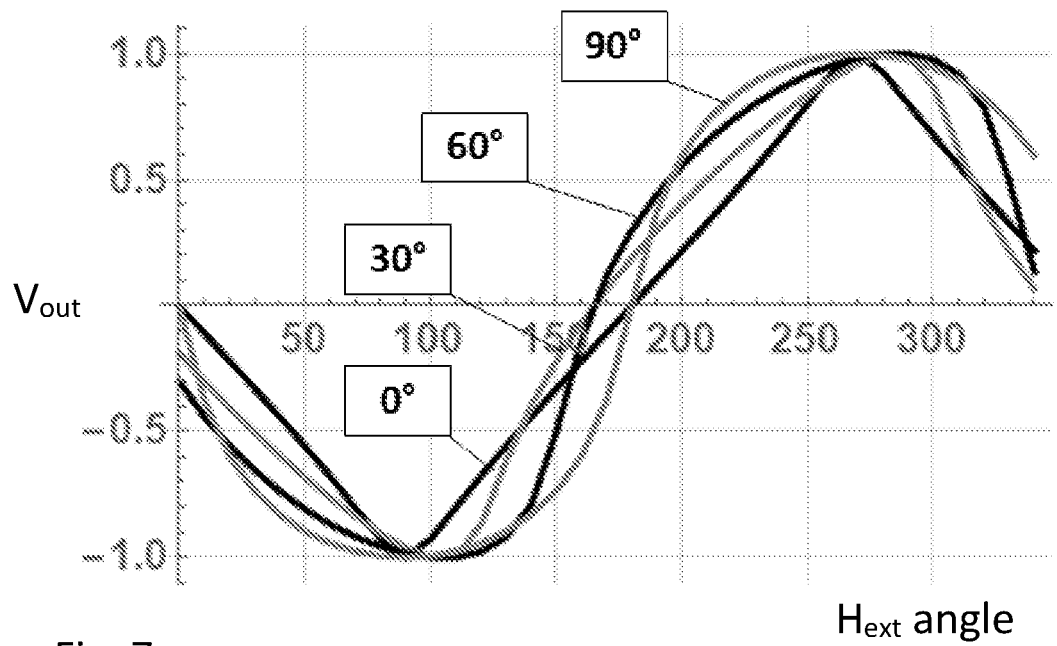
FIG. 7 shows distortion of the output voltage of the half-bridge sensing circuit of FIG. 5; according to another variant.

FIG. 7 shows distortion of the output voltage $V_{out}$ of the half-bridge sensing circuit 100 of FIG. 5 as a function of the orientation of the external magnetic field 60, for the angle between the easy axis of the in-plane uniaxial anisotropy in the sense layer 21 and the pinning direction 231 of the reference magnetization 230.

The shape of this type of distortion depends on how the anisotropy easy axis is oriented with respect to the pinning direction 231. In particular, when the easy axis is oriented substantially parallel the pinning direction 231 (90°), the half-bridge output voltage $V_{out}$ has characteristic "rectangular" shape. When the easy axis is oriented substantially perpendicular to the pinning direction 231 (0°), the half-bridge output voltage $V_{out}$ has characteristic "triangular" shape.

Figure 8:
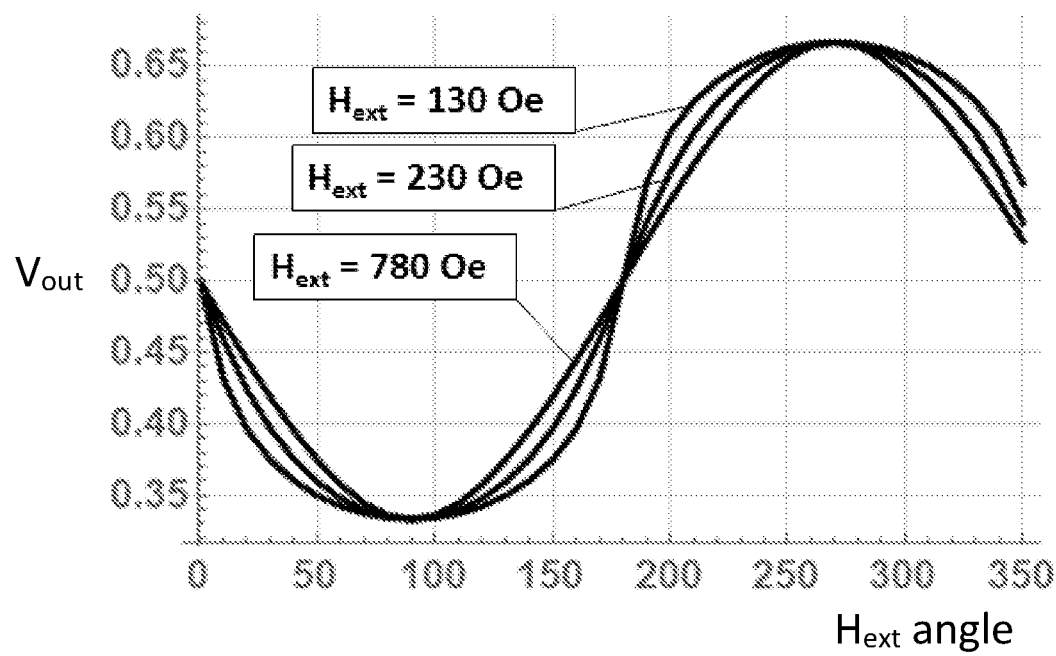
FIG. 8 shows distortion of the output voltage of the half-bridge sensing circuit of FIG. 5; according to yet another variant.

FIG. 8 shows distortion of the output voltage $V_{out}$ of the half-bridge sensing circuit 100 of FIG. 5 as a function of the orientation of the external magnetic field 60, for a magnitude of the external magnetic field 60 of 130 Oe, 230 Oe and 780 Oe. The easy axis of magnetic anisotropy in sensing layer 210 is aligned with the reference layer pinning direction 231. Here, the distortion is due to finite in-plane uniaxial magnetic anisotropy of the sense layer 210. The distortion becomes more pronounced when the magnitude of the external magnetic field 60 decreases.

In an embodiment, a "compensation" effect can be obtained by combining the "triangular" distortion of the output signal $V_{out}$ due to the finite magnetic stiffness of reference magnetization 230, with the "rectangular" distortion when the easy axis of the sense magnetization 210 is oriented substantially parallel the pinning direction 231 of the reference magnetization 230. The compensation effect corresponds to the two distortions that cancels each other and provides better sinusoidal shape of half-bridge output $V_{out}$.

Since these two types of distortions have opposite dependence on the external magnetic field 60, the compensation effect will be reached within certain magnitude range of the external magnetic field 60.

Figure 9:
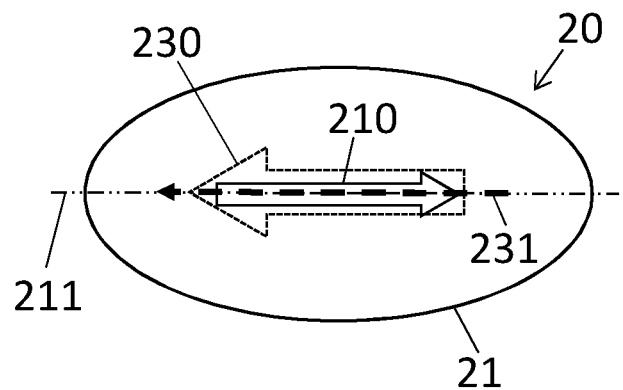
FIG. 9 shows a top view of the magnetic sensor element, according to an embodiment.

In an embodiment represented in FIG. 9, the sense layer 21 comprises an in-plane uniaxial sense magnetic anisotropy having an easy axis 211 that is aligned substantially parallel to the pinning direction 231, such that an angular deviation in the alignment of the direction of the sense magnetization 210 in the external magnetic field 60 is minimized for a range of external magnetic field 60.

In the example of FIG. 9, the in-plane uniaxial sense magnetic anisotropy of the sense layer 21 is provided by an elliptical shape of the sensor element 20 wherein the easy axis 211 corresponds to the long axis of the elliptical shape that is aligned substantially parallel to the pinning direction 231.

In an embodiment, a ratio of the magnitude of the sense magnetic anisotropy of the sense layer 21 over the pinning strength of the reference magnetization 230 in the pinning direction 231 is selected such as to adjust the range of external magnetic field 60 for which the compensation effect is obtained, i.e., for which the angular deviation is minimized. An example of such adjustment is shown on FIG. 10.

For example, such ratio can be selected to obtain a compensation effect that corresponds to the angular deviation (or error) being minimized within a predetermined range of external magnetic field 60. For example, the ratio can be selected such that the angular deviation is equal or less than 0.5° within a range of external magnetic field 60 of about 200 Oe with the central working point of 800 Oe (FIG. 10c).

Simulations (see FIG. 10) show that for typical stiffness values of the reference magnetization 230, such compensation effect can be obtained for a magnitude range of the external magnetic field 60 of about 200 Oe. In this magnitude range of the external magnetic field 60, the angular error can be as low as 0.5°.

Thus, aligning the anisotropy easy axis of the sense layer 210 substantially parallel to the pinning direction 231 of the reference magnetization 230 allows for having a low angular error, for example an angular error equal or lower than 0.5°, within a magnitude range of the external magnetic field $H_{ext}$ of about 200 Oe at any desired central working point.

The desired central working point of the external magnetic field 60 for which the angular error is low can be selected by adjusting the strength of the anisotropy of the sense layer 21 with respect to the pinning strength of the reference magnetization 230.

The strength of the anisotropy of the sense layer 21 can be adjusted by adjusting the ellipticity of the magnetic sensor element 20, in the case the sense magnetic anisotropy of the sense layer 21 is provided by an elliptical shape of the magnetic sensor element 20. The ellipticity can be modified to take into account other sources of magnetic anisotropy in sense layer 21 (for example, growth-induced, stress-induced anisotropy etc.).

Figure 10A:
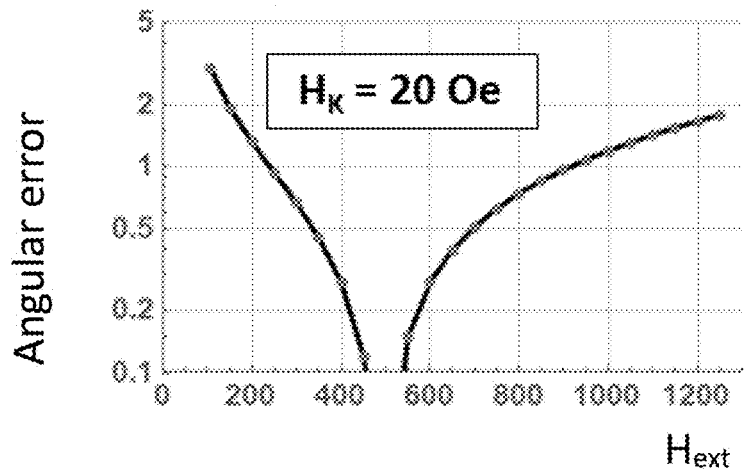
FIGS. 10a to 10c show simulations results of the angular deviation as a function of the external magnetic field for a strength of the magnetic anisotropy of the sense layer equal to 20 Oe (FIG. 10a), 40 Oe (FIG. 10b) and 60 Oe (FIG. 10c)
Figure 10B:
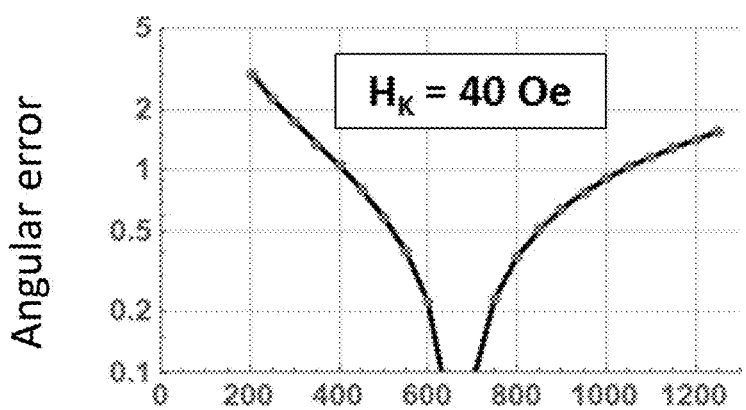
Figure 10C:
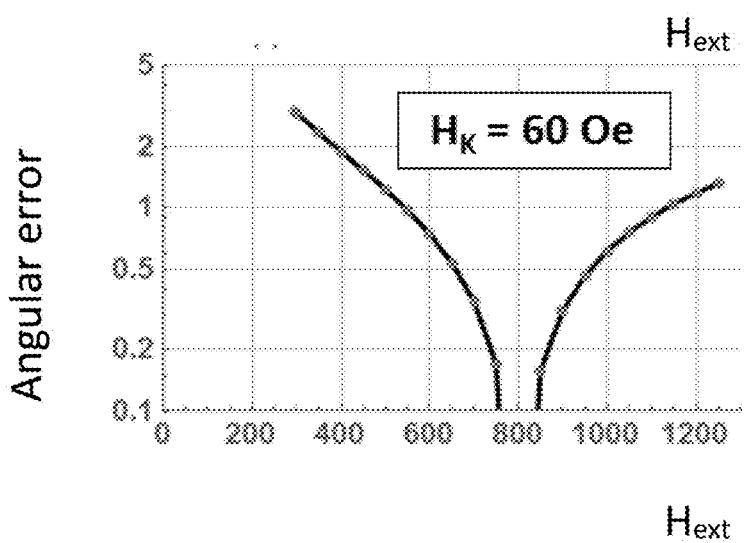

FIGS. 10a to 10c show simulations results of the angular deviation as a function of the external magnetic field for a strength $H_k$ of the magnetic anisotropy of the sense layer 21 equal to 20 Oe (FIG. 10a), 40 Oe (FIG. 10b) and 60 Oe (FIG. 10c).

FIGS. 10a to 10c show that an angular error equal or lower than 0.5° can be obtained for: an external magnetic field $H_{ext}$ between about 400 Oe and 700 Oe for a strength $H_k$ of the magnetic anisotropy of the sense layer 21 equal to 20 Oe; an external magnetic field $H_{ext}$ between about 500 Oe and 800 Oe for a strength $H_k$ of the magnetic anisotropy of the sense layer 21 equal to 40 Oe; and an external magnetic field $H_{ext}$ between about 700 Oe and 900 Oe for a strength $H_k$ of the magnetic anisotropy of the sense layer 21 equal to 60 Oe.

Figure 11:
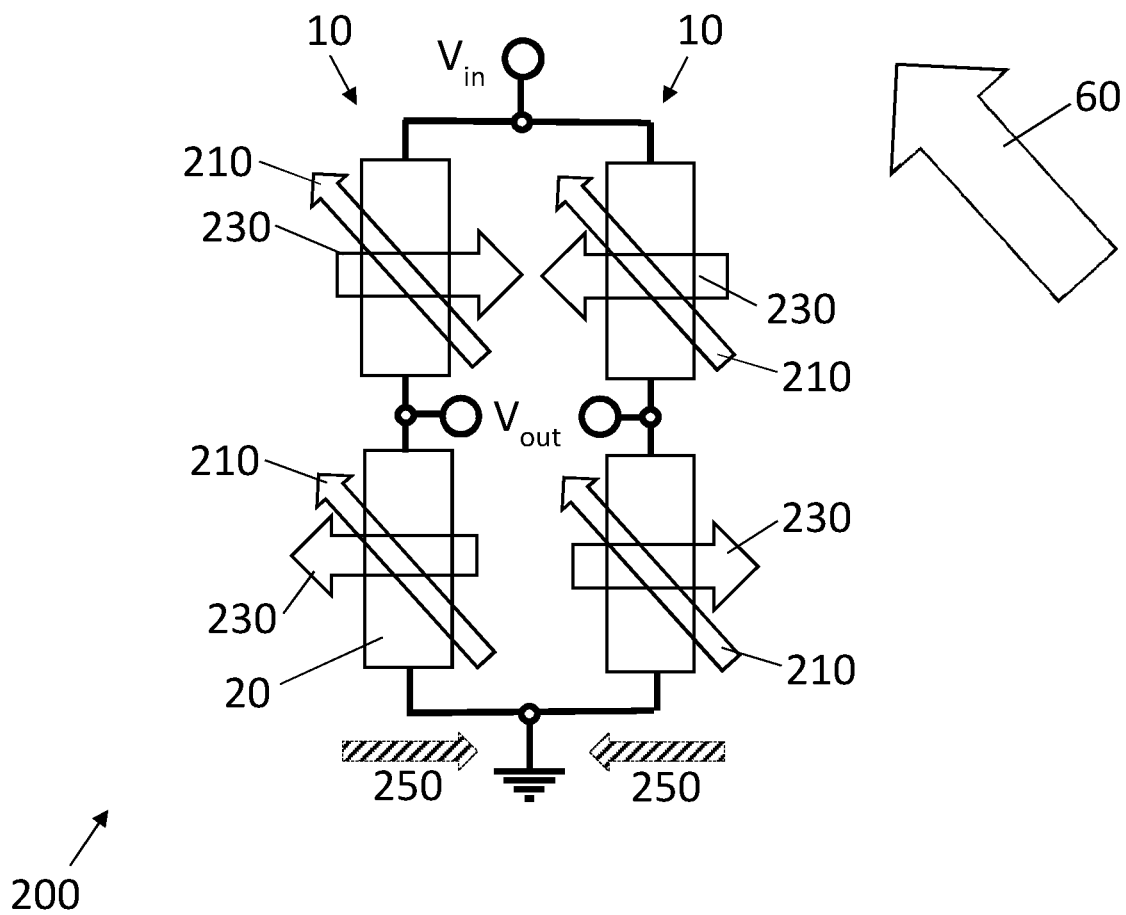
FIG. 11 shows plurality of sensor elements arranged in a full bridge sensing circuit, according to an embodiment.
Figure 12:
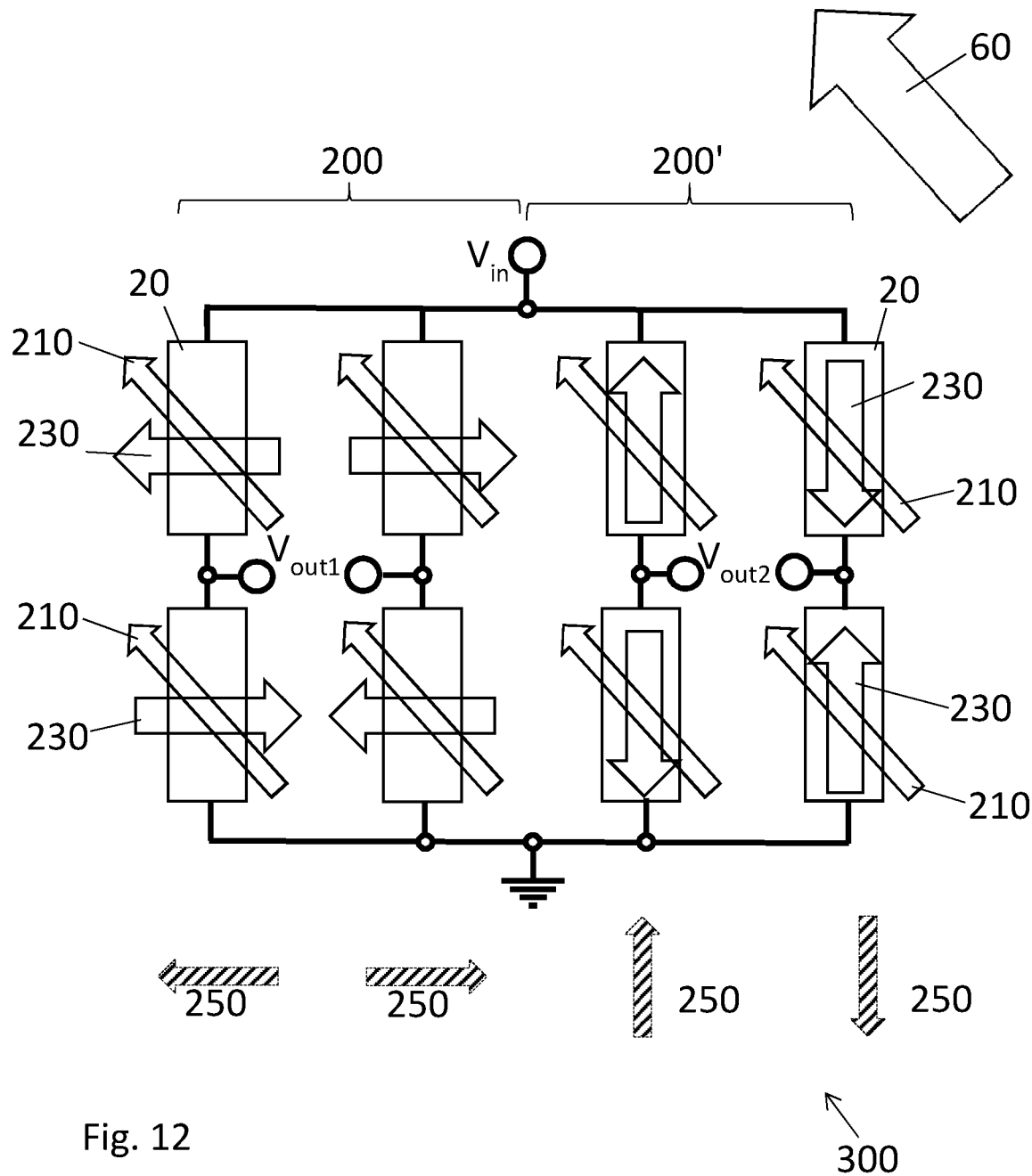
FIG. 12 shows an example of a full 2D sensor device circuit comprising two full-bridge circuits, according to an embodiment.

In a preferred embodiment, the plurality of sensor elements 20 are arranged in a half-bridge circuit, such as the half-bridge sensing circuit 100 shown in FIG. 5, or a full bridge sensing circuit 200 shown in FIG. 11. The full-bridge circuit 200 comprises two half-bridge circuits 100, each producing an output voltage $V_{out}$ between the two sensor elements 20. FIG. 12 shows an example of a full 2D sensor device circuit 300 comprising two full-bridge circuits 200 and 200'. The sensing axis 250 of one of the full bridge circuits 200 is oriented substantially orthogonal to the sensing axis 250 of the other full bridge circuit 200'. One of the full-bridge circuits 200 produces a first output voltage $V_{out1}$ between the two sensor elements 20 of each half-bridges. The other full-bridge circuit 200' produces a second output voltage $V_{out2}$ between the two sensor elements 20 of each half-bridges. Magnetic field angle can be calculated applying arctangent function to ratio of measured voltages $V_{out1}/V_{out2}$. The configuration of the full 2D sensor device circuit 300 allows for sensing the external magnetic field 60 in all orientations in a plane (for example an external magnetic field 60 having a horizontal and vertical component in the page of FIG. 12).

Magnetic anisotropy in the sensing layer 21 is adjusted by the ellipticity of the sensor element 20.

The sensing elements 20 comprised in the 2D sensors 100, 200, 300 have a sensibly equal magnetic anisotropy strength in the sensing layer 210. In each sensing element 20 the easy axis 211 of anisotropy in the sensing layer 21 coincides with the pinning direction of reference layer 230. Each branch of the half-bridge circuit 100, the full bridge circuit 200 or the circuit 300 comprising two full bridges 200 as the one shown in FIG. 11, comprises two sensor elements 20, wherein the pinning direction 231 of the reference magnetization 230 in one sensor element 20 being oriented substantially orthogonal to the pinning direction 231 of the reference magnetization 230 in the other sensor element 20.

REFERENCE NUMBERS AND SYMBOLS 10 magnetic angular sensor device, sensing circuit
100 half-bridge sensing circuit
200 full-bridge sensing circuit
300 full-bridge sensor circuit
20 magnetic sensor element
21 ferromagnetic sensing layer
210 sense magnetization
211 easy axis of the sense magnetic anisotropy
22 tunnel barrier layer
23 ferromagnetic reference layer
230 reference magnetization
231 pinning direction
24 pinning layer
60, $H_{ext}$ external magnetic field
$H_k$ strength of magnetic anisotropy
$H_{ud}$ strength of reference layer pinning
$V_{in}$ input voltage
$V_{out}$ output voltage
θ angle

What is claimed is:

1. Magnetic angular sensor device configured to sense an external magnetic field, the sensor device comprising a plurality of magnetic sensor elements,
   each sensor element comprising a magnetic tunnel junction containing a ferromagnetic reference layer having a reference magnetization that is pinned in a pinning direction, a ferromagnetic sense layer having a sense magnetization that can be oriented in an external magnetic field, and a tunnel barrier spacer layer, between the reference layer and the sense layer;
   wherein the sense layer of at least a portion of said plurality of sensor elements comprises an in-plane uniaxial sense magnetic anisotropy having an easy axis that is aligned substantially parallel to the pinning direction, such that an angular deviation in the alignment of the direction of the sense magnetization in the external magnetic field is equal or less than 0.5° within a range of external magnetic field of 200 Oe.

2. The sensor device according to claim 1, wherein the sense layer of the other portion of said plurality of sensor elements comprises substantially no sense magnetic anisotropy.

3. The sensor device according to claim 2, wherein the sense layer of the other portion of said plurality of sensor elements comprises a substantially circular shape.

4. The sensor device according to claim 1, wherein the sense layer of the other portion of said plurality of sensor elements comprises an in-plane uniaxial sense magnetic anisotropy having an easy axis that is aligned substantially perpendicular to the pinning direction.

5. The sensor device according to claim 4, wherein the sense layer of the other portion of said plurality of sensor elements comprises an elliptical shape having a short axis that is aligned substantially parallel to the pinning direction.

6. The sensor device according to claim 1, wherein the sense layer of said at least portion of said plurality of sensor elements comprises an elliptical shape having a long axis that is aligned substantially parallel to the pinning direction.

7. The sensor device according to claim 6, wherein the sense layer of the other portion of said plurality of sensor elements comprises an elliptical shape having a short axis that is aligned substantially parallel to the pinning direction.

8. The sensor device according to claim 6, wherein the sense layer of the other portion of said plurality of sensor elements comprises a substantially circular shape.

9. The sensor device according to claim 1, wherein a ratio of a magnitude of the sense magnetic anisotropy over an exchange bias field is selected such as to select said range of external magnetic field for which the angular deviation is minimized.

10. The sensor device according to claim 1, wherein said plurality of sensor elements are arranged in a half-bridge or full bridge circuit.

11. The sensor device according to claim 10, comprising a circuit formed from two full bridges connected in parallel.

12. The sensor device according to claim 10, wherein half-bridge circuit branch or full bridge-based circuits comprises two sensor elements, the pinning direction of the reference magnetization in one sensor element being oriented substantially orthogonal to the pinning direction of the reference magnetization in the other sensor element.

* * * * *